(12) United States Patent
Schäffter et al.

(10) Patent No.: US 7,332,909 B2
(45) Date of Patent: Feb. 19, 2008

(54) MR IMAGING METHOD

(75) Inventors: Tobias Schäffter, Hamburg (DE);
Holger Eggers, Kaltenkirchen (DE);
Peter Börnert, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/554,120

(22) PCT Filed: Apr. 13, 2004

(86) PCT No.: PCT/IB2004/050417

§ 371 (c)(1),
(2), (4) Date: Aug. 8, 2006

(87) PCT Pub. No.: WO2004/095048

PCT Pub. Date: Nov. 4, 2004

(65) Prior Publication Data

US 2006/0273790 A1    Dec. 7, 2006

(30) Foreign Application Priority Data

Apr. 23, 2003  (EP) .................. 03101107

(51) Int. Cl.
*G01V 3/00* (2006.01)
(52) U.S. Cl. ..................... 324/309; 324/307
(58) Field of Classification Search ........... 324/309, 324/307
See application file for complete search history.

(56) References Cited

U.S. PATENT DOCUMENTS

| 4,684,891 A | 8/1987 | Feinberg |
| 4,709,212 A | 11/1987 | MacFall et al. |
| 4,734,646 A | 3/1988 | Shenoy et al. |
| 5,270,651 A | 12/1993 | Wehrli |
| 5,539,313 A | 7/1996 | Meyer |
| 5,557,204 A | 9/1996 | Lenz |

(Continued)

FOREIGN PATENT DOCUMENTS

WO    WO 01/74245 A1    10/2001

OTHER PUBLICATIONS

Altbach, M.I., et al.; Radial Fast Spin-Echo Method for T2-Weighted Imaging and T2 Mapping of the Liver; 2002; J. MRI; 16:179-189.

(Continued)

*Primary Examiner*—Louis M. Arana

(57) ABSTRACT

A method for generating an MR image of an object situated in an examination volume of an MR apparatus begins with the acquisition of a plurality of echo signals having at least two different echo-time values (t1, t2, t3). The echo signals are generated from high-frequency pulses and magnetic-field gradient pulses by an imaging sequence. An intermediate MR image (5, 6, 7) is then reconstructed for each echo-time value (t1, t2, t3). By analyzing these intermediate MR images (5, 6, 7), local relaxation times ($T2^*(x)$) and/or local frequency shifts ($\Delta\omega(x)$) are determined by taking account of the respective echo-time values (t1, t2, t3). Finally, a definitive MR image (11) is reconstructed from the echo signals (1) in their entirety.

20 Claims, 2 Drawing Sheets

U.S. PATENT DOCUMENTS

| | | | |
|---|---|---|---|
| 5,578,923 | A | 11/1996 | Chen |
| 5,742,163 | A * | 4/1998 | Liu et al. .................... 324/309 |
| 6,064,205 | A | 5/2000 | Zhou et al. |
| 6,321,107 | B1 | 11/2001 | Derbyshire |
| 6,408,201 | B1 | 6/2002 | Foo et al. |
| 2003/0065258 | A1 | 4/2003 | Gupta et al. |

OTHER PUBLICATIONS

Song, H.K., et al.; k-Space Weighted Image Contrast (KWIC) for Contrast Manipulation in Projection Reconstruction MRI; 2000; MRM; 44:825-832.

* cited by examiner

MR IMAGING METHOD

The invention relates to an MR method for generating an MR image of an object situated in an examination volume of an MR apparatus, wherein a plurality of echo signals that are generated from high-frequency pulses and magnetic-field gradient pulses by means of a suitable imaging sequence are acquired with different echo-time values.

The invention also relates to an MR apparatus for performing the method and to a computer program for an apparatus of this kind.

In MR imaging, the location of the magnetization of nuclei within the examination volume is usually performed by means of temporally variable, spatially inhomogeneous magnetic fields (magnetic field gradients). The MR signals used for reconstructing the images are recorded, in the time domain, in the form of a voltage that is induced in a high-frequency coil arrangement surrounding the examination volume under the influence of a suitable sequence of magnetic-field gradient pulses and high-frequency pulses. There are a range of known imaging sequences in which, for the purpose of achieving imaging that is as fast as possible, the MR signals are generated, after the magnetization of the nuclei has been excited, as echo signals having different echo-time values by means of a single high-frequency pulse. Such sequences are also referred to as "multi-echo sequences". Particular mention should be made in this connection of what are called gradient echo sequences, such as the echo planar imaging (EPI) sequence, for example, and of imaging sequences in which the echo signals are generated by refocusing by means of additional high-frequency pulses, such as, for example, the turbo spin echo (TSE) sequence. The actual reconstruction of the image from the echo signals that are acquired is generally performed by Fourier transformation of the time-related signals. The sampling of the spatial frequency space (what is called the k-space), i.e. the space by which the volumetric region to be imaged, or field of view (FOV), and the image resolution are determined, is preset by the number of high-frequency pulses and magnetic-field gradient pulses used, the interval of time between them and their duration and strength. The requirements that have to be met by the FOV and the image resolution preset the number of phase encoding steps in the sampling of the spatial frequency space and hence the duration of the imaging sequence.

In MR imaging methods of the kind outlined above, in which a plurality of echo signals for generating an image are acquired by the use of multi-echo sequences, there is the problem that the reconstructed MR images are prone to artifacts that derive in some cases from non-idealities in the acquisition of the signals and in other cases from relaxation phenomena. Non-idealities of this kind become apparent principally as phase errors in the echo signals acquired. Phase errors come into being as a result of, for example, local inhomogeneities in the static magnetic field of the kind that are unavoidable, particularly in medical MR imaging, due to the differing individual magnetic susceptibility characteristics of the patients who are examined. These inhomogeneities in the field give rise to local shifts in the nuclear-magnetic resonant frequency within the examination volume, which in turn are the cause of unsharpness in the reconstruction of the image and of distortion in the image. Another reason for artifacts in the image is, as mentioned above, relaxation phenomena due to transverse relaxation of the magnetization of the nuclei ($T_2$ or $T_2^*$ relaxation). The artifacts in the image caused by relaxation comprise shadows and unwanted fluctuations in the brightness of the image. Transverse relaxation is due chiefly to paramagnetic effects and inter-nuclear interactions.

There are known MR imaging methods in which image artifacts due principally to phase errors are corrected. What are termed "conjugate phase" reconstruction algorithms are suitable for this purpose and use is routinely made of them. In methods of this kind, knowledge of the local frequency shifts is made use of to allow the phases of the echo signals acquired to be corrected. The methods known from the prior art do, however, have the disadvantage that it is necessary for additional measurement signals to be acquired from the examination volume to allow the local frequency shifts to be determined. Because of the additional measuring time needed to acquire the data required for correcting the image artifacts, imaging by the methods known from the prior art takes an undesirably long time. Also, image artifacts deriving from relaxation phenomena usually remain uncorrected.

Also known from the prior art are MR imaging methods in which it is particularly important for the local relaxation times to be determined, even independently of the correction of any image artifacts. The display of the distribution of the relaxation times in space, and also the quantitative determination of this distribution, are an important matter when, for example, contrast media that have an influence on the transverse relaxation of the core magnetization are being used in the MR imaging. Contrast media of this kind, based on oxides of iron, for example, are used for example for tracking marked cells by MR and for locating active principles within the examination volume. Contrast media that affect the transverse relaxation time ($T_2$ or $T_2^*$) are also used in functional MR imaging (fMRI). It is known from the prior art for $T_2^*$-weighted MR images, for example, to be acquired to allow the distribution of the relaxation times in space to be displayed. However, it is often desirable for the local relaxation times to be determined quantitatively. When this is done, the problem again arises that determination of the local relaxation times makes it necessary for MR signals intended specifically for this purpose to be acquired from the examination volume, that is to say ones additional to the MR signals intended for the actual reconstruction of the image. This makes the overall time required for measurement undesirably long.

Against this background, it is an object of the present invention to provide an MR imaging method that makes it possible for the local relaxation times and/or the local frequency shifts within the examination volume to be determined without any additional measuring time.

This object is achieved by an MR method as defined in claim 1.

The method according to the invention begins with the acquisition of a plurality of echo signals having at least two different echo-time values. This is done in the usual way by means of a suitable multi-echo imaging sequence such as, for example, an EPI sequence or a TSE sequence. A plurality of echo signals having different respective echo-time values are acquired in this case after each injection of a high-frequency pulse. The data acquired thus comprises a plurality of sets of echo signals, with each set having a given echo-time value assigned to it. From each of these sets, i.e. for each individual echo-time value, the next step is, in accordance with the invention, for an intermediate MR image to be reconstructed. Each intermediate MR image is thus based on echo signals that are acquired with a given echo-time value. This makes it possible for the local relaxation times and/or the local frequency shifts to be determined by analyzing the intermediate MR images, in which case account is taken of the echo-time values assigned to the individual intermediate MR images. The local relaxation times can be determined by examining, for each individual point-element of the image (pixel or voxel), the change in the brightness of the intermediate MR images as a function of the particular echo-time value. Local frequency shifts can be determined in a similar way by determining, for each point-element of the image, the movement of the phase of the complex image value as a function of the echo-time value. Finally, a definitive MR image is reconstructed in accordance with the invention from the echo signals in their entirety.

A basic idea of the invention is for the local relaxation times or the local frequency shifts to be determined directly from the echo signals intended for the reconstruction of the definitive MR image. This ensures that no additional measuring time is required to allow the local distribution of the relaxation times within the examination volume or the local field inhomogeneities to be determined.

In the method according to the invention, the acquisition of the echo signals is accomplished by non-Cartesian, and in particular radial, sampling of the spatial frequency space associated with the examination volume. To generate the echo signals, radial multi-echo imaging sequences (such as, say, EPI or REPI sequences), for example, may advantageously be used in a known fashion in this case. An appropriate turbo spin echo sequence (a so-called TSE sequence) would also be suitable for determining the local relaxation times ($T_2$). When the sampling of the spatial frequency space is radial, the space is sampled at a higher density in the center than at the periphery. As a result of this, the intermediate MR images can be reconstructed at lower resolution than the definitive MR images, in which case undersampling artifacts do not occur in the intermediate MR images. The lower resolution of the intermediate MR images is generally adequate to allow the local relaxation times or local frequency shifts to be determined. The possibility does exist of reconstructing the intermediate MR images at low resolution directly from the corresponding echo signals, in which case only signals from the center of the spatial frequency space are used as a basis. Alternatively, the intermediate MR images can also be reconstructed at high resolution, in which case intermediate MR images of suitably reduced resolution are then usefully produced from the high-resolution intermediate MR images by filtering. Or, the intermediate MR images may be reconstructed at high resolution by adding echo signals having similar echo-time values (see H. K. Song et al. in Magnetic Resonance in Medicine, Vol. 44, pages 825 to 832, 2000). Undersampling artifacts that may possibly occur can be avoided in the high-resolution intermediate images in this way.

The advantageous possibility exists in accordance with the invention of the local relaxation times and/or the local frequency shifts that are determined being used to correct image artifacts caused by relaxation phenomena and/or field inhomogeneities in the definitive MR image. This is accomplished in a conventional manner by subjecting the echo signals, which are complex values, to phase correction in line with the local relaxation times and/or the local frequency shifts that are determined. Both local relaxation phenomena and also local field inhomogeneities can be allowed for by way of the phase correction by combining the local relaxation times and the local phase shifts for each point-element of the image into a phase error in the form of a complex value.

The method according to the invention also makes it possible on the one hand for the local relaxation times to be determined quantitatively and on the other hand for an MR image unaffected by relaxation phenomena to be reconstructed at the same time. For the purpose of visual display, this allows a representation of the local relaxation times to be superimposed on a representation of the definitive MR image. This can, for example, be done by showing the representation of the definitive MR image in different colors in line with the distribution of the relaxation times.

An MR apparatus suitable for performing the method according to the invention has a main field coil for generating a homogeneous static magnetic field in an examination volume, a plurality of gradient coils for generating magnetic field gradients in the examination volume, at least one high-frequency coil for generating high-frequency fields in the examination volume and/or for receiving echo signals from the examination volume, and a central control unit for operating the gradient coils and the high-frequency coil, plus a reconstruction and display unit for processing and showing the echo signals. The method described above can be performed on the MR apparatus according to the invention by means of a suitable programmed control means for the central control unit or the reconstruction and display unit, as the case may be.

The method according to the invention may be made available to the users of pieces of MR apparatus in the form of a corresponding computer program. The computer program may be stored on suitable data carriers, such as CD-ROMs or floppy disks for example, or it may be downloaded to the central control unit of the MR apparatus or to its reconstruction and display unit, as the case may be, over the internet.

These and other aspects of the invention are apparent from and will be elucidated with reference to the embodiments described hereinafter.

Figure 1:
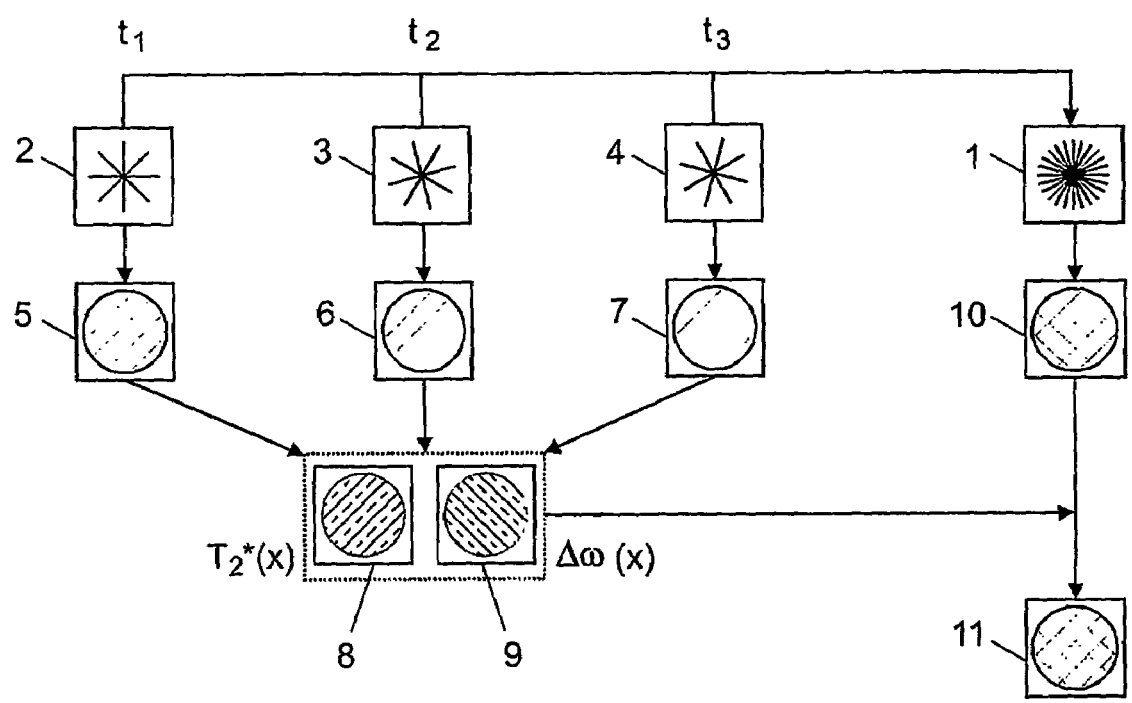
FIG. 1 is a diagrammatic representation of the procedure followed in the method according to the invention.

The method shown in FIG. 1 begins with the acquisition of a plurality of echo signals having three different echo-time values $t_1$, $t_2$ and $t_3$. The echo signals acquired exist, in their entirety, as a data set 1. The acquisition of the echo signals takes place in accordance with the invention by means of a multi-echo imaging sequence in which the spatial frequency space is sampled radially. The echo signals contained in the data set 1 can be divided into three data subsets 2, 3 and 4 corresponding to the echo-time values $t_1$, $t_2$ and $t_3$ respectively. Due to the radial sampling pattern, the center of the spatial frequency space is sampled at an adequate density in the case of each of the data subsets 2, 3 and 4, thus enabling intermediate MR images 5, 6 and 7 of low resolution to be reconstructed from respective ones of the data subsets 2, 3 and 4. Each of the intermediate MR images 5, 6 and 7 is thus based on echo signals that are acquired with given echo-time values $t_1$, $t_2$ and $t_3$ respectively. The next step is for local relaxation times $T_2^*(x)$ and local frequency shifts $\Delta\omega(x)$ to be determined from the intermediate MR images 5, 6 and 7 by taking account of the respective echo-time values $t_1$, $t_2$ and $t_3$. The position-dependent relaxation times $T_2^*(x)$ exist as a data set 8 and the local frequency shifts $\Delta\omega(x)$ as a data set 9. These data sets assign a value of relaxation time or a value of frequency shift to each image point-element within the intermediate MR images 5, 6 and 7. From the complete data set 1, a high-resolution MR image 10 is generated that, due to the relaxation phenomena and the local field inhomogeneities, is affected by image artifacts. The local relaxation times $T_2^*(x)$ and local frequency shifts $\Delta\omega(x)$ that are determined are used to correct these image artifacts and thus to generate a definitive, artifact-free MR image 11.

To avoid image artifacts, a correction can be made in accordance with the following formula when the definitive MR image 11 is being reconstructed:

$$f'(x) = \int F(k) e^{i\Delta\omega'(x)i(k)} e^{ikx} dk.$$

In the formula, F(k) represents the echo signals in the spatial frequency space and f'(x) the definitive MR image. f'(x) approximates to the "ideal" MR image f(x) that reproduces the actual appearance of the object being examined. t(k) represents the point in time at which the relevant point in the spatial frequency space is sampled. The formula that applies to Δω'(x) is, n accordance with the present invention, the following:

$$\Delta\omega'(x) = \Delta\omega(x) - \frac{i}{T_2^*(x)}.$$

The echo signal data is thus subjected to a correction in which what is taken as a basis is the frequency shift Δω'(x) in the form of a complex value that is composed of the spatial frequency shift Δω(x) and the local relaxation time $T_2^*(x)$. The generation of the definitive artifact-free MR image f'(x) in accordance with the above formula constitutes an extension of the conjugate phase reconstruction algorithm, which is known per se, the extension comprising taking a frequency shift Δω'(x) in the form of a complex value as a basis for the correction of the echo signal data F(k).

Known implementations of the conjugate phase reconstruction algorithm can easily be converted in accordance with the invention. The determination of the local frequency shifts Δω(x) and the local relaxation times $T_2^*(x)$ is advantageously performed in the way described above but it may also be performed in some other way before or after the acquisition of the MR signals F(k) containing the information proper for the image.

Figure 2:
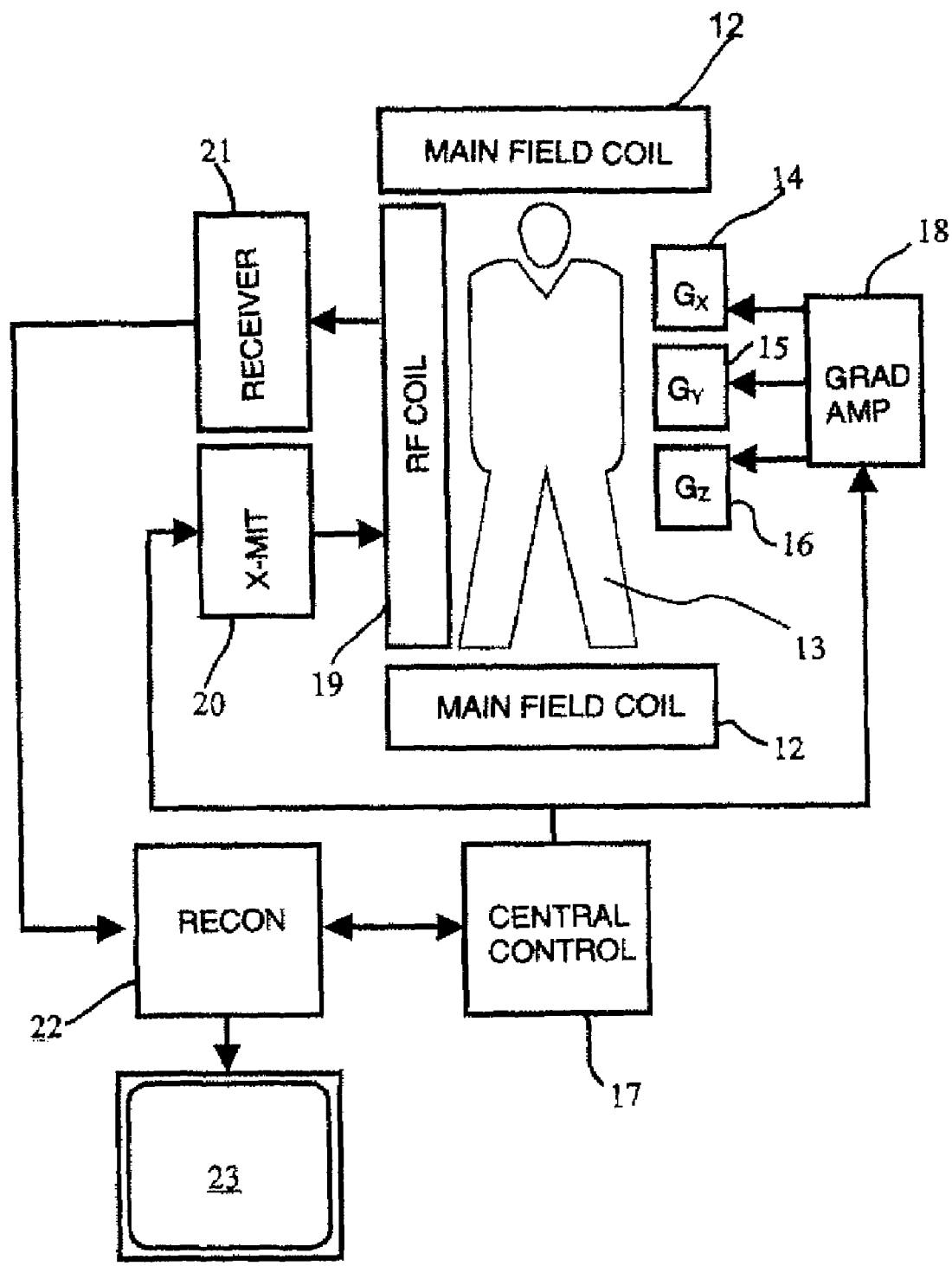
FIG. 2 shows an MR apparatus according to the invention.

FIG. 2 shows, as a block diagram, an MR apparatus on which the method according to the invention can be performed. The MR apparatus comprises a main field coil 12 for generating a homogeneous static magnetic field in an examination volume in which a patient 13 is situated. The MR apparatus also has gradient coils 14, 15 and 16 for generating magnetic field gradients in different directions in space within the examination volume. The pattern followed by the magnetic field gradients with time and in space within the examination volume is controlled by means of a central control unit 17, which is connected to the gradient coils 14, 15 and 16 via a gradient amplifier 18. Also forming part of the MR apparatus shown is a high-frequency coil 19 for generating high-frequency fields in the examination volume and for receiving echo signals from the examination volume. The high-frequency coil 19 is connected to the control unit 17 via an emitting unit 20. The echo signals acquired by the high-frequency coil 19 are demodulated and amplified by means of a receiving unit 21 and fed to a reconstruction and display unit 22. The echo signals processed by the reconstruction and display unit 22 can be shown by means of a screen 23. The reconstruction and display unit 22 and the control unit 17 have a suitable programmed control means to allow the method described above to be performed.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An MR method for generating an MR image of an object situated in an examination volume of an MR apparatus, which method has the following steps:
   a) acquisition of a plurality of echo signals having at least two different echo-time values, the echo signals being generated from high-frequency pulses and magnetic-field gradient pulses by means of an imaging sequence, the acquisition of the echo signals takes place by non-Cartesian, and in particular radial, sampling of the spatial frequency space associated with the examination volume;
   b) reconstruction from the corresponding echo signals of one intermediate MR image for each echo-time value;
   c) determination of local relaxation times and/or local frequency shifts by analyzing the intermediate MR images while taking account of the respective echo-time values;
   d) reconstruction of a definitive MR image from the echo signals in their entirety.

2. The MR method as claimed in claim 1, wherein the intermediate MR images are reconstructed at a lower resolution than the definitive MR image.

3. The MR method as claimed in claim 1, wherein the imaging sequence is an echo planar imaging sequence.

4. An MR apparatus having a main field coil for generating a homogeneous static magnetic field in an examination volume, a plurality of gradient coils for generating magnetic field gradients in the examination volume, at least one high-frequency coil for generating high-frequency fields in the examination volume and for receiving echo signals from the examination volume, and a central control unit for operating the gradient coils and the high-frequency coil, plus a reconstruction and display unit for processing and showing the echo signals, wherein the central control unit and the reconstruction and display unit have a programmed control means that operates by the method claimed in claim 1.

5. A computer medium which, when loaded into a computing device, controls the computing device to perform the method as claimed in claim 1.

6. The MR method as claimed in claim 1, wherein the local relaxation times and/or local frequency shifts that are determined are used to correct image artifacts caused by relaxation phenomena and/or field inhomogeneities in the definitive MR image.

7. An MR method for generating an MR image of an object situated in an examination volume of an MR apparatus which method has the following step:
   a) acquisition of a plurality of echo signals having at least two different echo-time values, the echo signals being generated from high-frequency pulses and magnetic-field gradient pulses by means of an imaging sequence;
   b) reconstruction from the corresponding echo signals of one intermediate MR image for each echo-time value;
   c) determination of local relaxation times and/or local frequency shifts by analyzing the intermediate MR images while taking account of the respective echo-time value;
   d) correcting image artifacts caused by relaxation phenomena and/or field inhomogeneities in the definitive MR image using the determined local relaxation times and local frequency shifts; and e) reconstruction of a definitive MR image from the echo signals in their entirety.

8. The MR method as claimed in claim 7, wherein the values of local relaxation times and values of local frequency shifts ($\Delta\omega(x)$) that are determined are used to correct image artifacts caused by relaxation phenomena and field inhomogeneities in the MR image, with a complex-variable local frequency shift ($\Delta\omega'(x)$) in accordance with:

$$\Delta\omega'(x) = \Delta\omega(x) - \frac{i}{T_2^*(x)}.$$

9. The MR method as claimed in claim 7, wherein in step a) of the method, the acquisition of the echo signals takes place by radial sampling of the spatial frequency space associated with the examination region.

10. The MR method as claimed in claim 7, wherein the intermediate MR images are reconstructed at a lower resolution than the definitive MR image.

11. The MR method as claimed in claim 7, wherein the imaging sequence is an echo planar imaging sequence.

12. An MR apparatus having a main field coil for generating a homogeneous static magnetic field in an examination volume, a plurality of gradient coils for generating magnetic field gradients in the examination volume, at least one high-frequency coil for generating high-frequency fields in the examination volume and for receiving echo signals from the examination volume, and a central control unit for operating the gradient coils and the high-frequency coil, plus a reconstruction and display unit for processing and showing the echo signals, wherein the central control unit and the reconstruction and display unit have a programmed control means that operates by the method claimed in claim 7.

13. A computer medium which, when loaded into a computing device, controls the computing device to perform the method as claimed in claim 7.

14. An MR method for generating an MR image of an object situated in an examination volume of an MR apparatus, which method has the following steps:
   a) acquisition of a plurality of echo signals having at least two different echo-time values, the echo signals being generated from high-frequency pulses and magnetic-field gradient pulses by an imaging sequence;
   b) reconstruction from the corresponding echo signals of an intermediate MR image for each echo-time value;
   c) determination of local relaxation times and/or local frequency shifts by analyzing the intermediate MR images while taking account of the respective echo-time values;
   d) reconstruction of a definitive MR image from the echo signals in their entirety;
   e) correction of image artifacts caused by relaxation phenomena and/or field inhomogeneities in the definitive MR image based on the determined local relaxation time and/or local frequency shifts; and
   f) superimposition of a representation of the local relaxation times on a representation of the definitive MR image for the purposes of display.

15. The MR method as claimed in claim 14, wherein in step a) of the method, the acquisition of the echo signals takes place by radial sampling of the spatial frequency space associated with the examination region.

16. The MR method as claimed in claim 14, wherein the intermediate MR images are reconstructed at a lower resolution than the definitive MR image.

17. The MR method as claimed in claim 14, wherein the imaging sequence is an echo planar imaging sequence.

18. The MR method as claimed in claim 14, wherein the values of the local relaxation times ($T_2^*(x)$) and the values of local frequency shifts ($\Delta\omega(x)$) are used to correct image artifacts caused by relaxation phenomena and field images in the definitive MR image with a complex-variable local frequency shift ($\Delta\omega'(x)$) in accordance with:

$$\Delta\omega'(x) = \Delta\omega(x) - i/T_2^*(x).$$

19. An MR apparatus having a main field coil for generating a homogeneous static magnetic field in an examination volume, a plurality of gradient coils for generating magnetic field gradients in the examination volume, at least one high-frequency coil for generating high-frequency fields in the examination volume and for receiving echo signals from the examination volume, and a central control unit for operating the gradient coils and the high-frequency coil, plus a reconstruction and display unit for processing and showing the echo signals, wherein the central control unit and the reconstruction and display unit have a programmed control means that operates by the method claimed in claim 14.

20. A computer medium which, when loaded into a computing device, controls the computing device to perform the method as claimed in claim 14.

* * * * *